United States Patent
Srinivasan Gopalan

(10) Patent No.: US 12,136,927 B2
(45) Date of Patent: Nov. 5, 2024

(54) SYNCHRONOUS ALIGNMENT OF MULTIPLE HIGH-SPEED DIVIDERS

(71) Applicant: TEXAS INSTRUMENTS INCORPORATED, Dallas, TX (US)

(72) Inventor: Madusudanan Srinivasan Gopalan, Issaquah, WA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 17/899,882

(22) Filed: Aug. 31, 2022

(65) Prior Publication Data
US 2024/0072812 A1  Feb. 29, 2024

(51) Int. Cl.
*H03L 7/099* (2006.01)
*H03L 7/081* (2006.01)
*H03L 7/085* (2006.01)

(52) U.S. Cl.
CPC .......... *H03L 7/0992* (2013.01); *H03L 7/0816* (2013.01); *H03L 7/085* (2013.01)

(58) Field of Classification Search
CPC ...... H03L 7/0992; H03L 7/0816; H03L 7/085
See application file for complete search history.

(56) References Cited

U.S. PATENT DOCUMENTS

| | | | | |
|---|---|---|---|---|
| 2002/0125961 A1* | 9/2002 | Jones | .................... | H03L 7/0891 327/12 |
| 2014/0115221 A1 | 4/2014 | Ganasan et al. | | |
| 2014/0153680 A1* | 6/2014 | Garg | .................... | G06F 1/10 375/371 |
| 2016/0041579 A1 | 2/2016 | Ali et al. | | |
| 2019/0288694 A1* | 9/2019 | Parekh | .................... | H03L 7/143 |
| 2019/0393867 A1 | 12/2019 | Tee et al. | | |
| 2021/0313993 A1 | 10/2021 | Bai et al. | | |
| 2021/0391864 A1* | 12/2021 | Rafi | .................... | H03L 7/0992 |
| 2022/0231691 A1 | 7/2022 | Jacquet et al. | | |

OTHER PUBLICATIONS

International Search Report in corresponding PCT Application No. PCT/US2023/031649, mailed Dec. 27, 2023.

\* cited by examiner

*Primary Examiner* — Jaison Joseph
(74) *Attorney, Agent, or Firm* — John R. Pessetto; Frank D. Cimino

(57) ABSTRACT

Timing alignment circuits for use in synchronizing output signals of high-speed dividers and other clock generators are provided. An example timing alignment circuit includes detection circuitry to receive first and second output signals, and output an error sign signal indicating whether the second output signal leads or lags the first output signal and a divide ratio slip signal. The example timing alignment circuit also includes control and aligning circuitry. The control circuitry receives a first local sync status signal and outputs a first control signal to a first component. The aligning circuitry receives the error sign signal and the divide ratio slip signal from the detection circuitry and also receives a second local sync status signal indicating when the first and second output signals are synchronized. The aligning circuitry outputs a second control signal to a second component that synchronously enables the output path receiving the clocks from different dividers with all rising edges aligned similar to a circuit exiting a synchronous reset.

23 Claims, 5 Drawing Sheets

SYNCHRONOUS ALIGNMENT OF MULTIPLE HIGH-SPEED DIVIDERS

FIELD OF DISCLOSURE

This disclosure relates to synchronously aligning the output signals of multiple high-speed dividers, and more particularly relates to controlling multiple high-speed dividers to align their respective output signals at a specific edge at a set time point during operation without performing a reset or other stop/start sequence on the dividers.

BACKGROUND

Many electronic systems are designed such that multiple integrated circuits thereof are to be operated synchronously. The respective clock signals of such circuits to be synchronized may be based on a common reference clock signal. Accurate high-speed clock distribution is important in various system applications, including serial interfaces between data converters, e.g., analog-to-digital converters (ADCs) or digital-to-analog converters (DACs) on one side, and logic devices, e.g., field-programmable gate arrays (FPGAs) or application-specific integrated circuits (ASICs) on the other side.

The electronics industry in general has adopted high-speed serial interface standards, each of which identified below is hereby incorporated by reference in its entirety. One such standard is the low voltage differential signaling (LVDS) standard TIA/EIA-644 promulgated by the Telecommunications Industry Association (TIA) and the Electronics Industries Alliance (EIA). Another serial interface standard that is particularly useful for interfaces between data converters and logic devices has been promulgated by the Joint Electron Devices Engineering Council (JEDEC) as JEDEC standards (JESD), which include JESD204A, JESD204B, and JESD204C standards (collectively, JESD204 standards). The JESD204 standards provide serial data rates of up to 12.5 gigabits per second (Gbps) while achieving deterministic latency across the serial links. Data octets are encoded into ten-bit symbols ("8b/10b" encoding) for synchronization of serializers/deserializers (SerDes), clock recovery, and direct current (DC) balance. A common JESD204B/C implementation includes a clock generator circuit, such as a digital phase-locked loop (DPLL), from which a device clock signal and a system reference clock signal is generated for each device with a serial interface. For example, eight devices in the system may reside in a single clock or DPLL domain, in which the device clocks and system reference clocks are based on one reference clock (e.g., the clock output by one PLL).

Within a given clock domain, such as in a JESD204B/C system, dynamic or on-the-fly adjustment of the phase of one of the generated device clocks or system reference clocks may be necessary during operation. In conventional JESD204B/C systems, such dynamic phase adjustment of one device clock in a clock domain requires all other clocks in the clock domain to be reset (e.g., stopped and restarted) and then resynchronized. If phase adjustment is to be applied to a system reference clock, the system reference modules throughout the clock domain must be reset and resynchronized after the phase offset is applied. In either case, dynamic clock phase adjustment of one device involves reset of all devices and clocks in the clock domain, which results in reduced system performance, utilization, and efficiency.

In an example in which multiple high-speed flip-flops of a system are to be synchronized reset is typically employed. A disadvantage of this approach is that additional circuit overhead needed to implement the reset function lowers the speed of each flip-flop. Such speed loss can be significant and limit the operating speed. One environment in which such speed loss is especially problematic is in a PLL in which the voltage-controlled oscillator (VCO) operates in the highest frequency region of the process node.

In this context, embodiments of this disclosure arise.

SUMMARY

In an example, a timing alignment circuit comprises detection circuitry having inputs configured to receive first and second output signals, respectively. The detection circuitry has an error sign output, and a divide ratio output, in which the error sign output is configured to output an error sign signal indicating whether the second output signal leads or lags the first output signal, and the divide ratio slip output is configured to output a divide ratio slip signal. The timing alignment circuit further comprises control circuitry configured to receive a first local sync status signal, the control circuitry having a first control output configured to output a first control signal to a first component. Aligning circuitry of timing alignment circuit is configured to receive the error sign signal and the divide ratio slip signal from the detection circuitry, and is further configured to receive a second local sync status signal indicating when the first and second output signals are synchronized. The aligning circuitry has a second control output configured to output a second control signal to a second component.

In an example, a system comprises n dividers including a reference divider, and n−1 non-reference dividers, each of the n dividers configured to output a data signal, wherein n is an integer of 2 or greater. The system further comprises n−1 instances of detection circuitry, associated with the n−1 non-reference dividers, respectively. Each instance of detection circuitry is configured to determine whether the data signal of the corresponding non-reference divider leads or lags the data signal of the reference divider and issue a corresponding error signal based on the determination. The system also comprises control circuitry coupled to the reference divider; and n−1 instances of aligning circuitry, each configured to align a respective one of the n−1 data signals of the n−1 non-reference dividers with the data signal of the reference divider. The system further comprises sync completion circuitry configured to output a global sync status signal when each of the data signals of the n−1 non-reference dividers is aligned with the data signal of the reference divider.

In an example, a method comprises applying a root clock signal to a reference divider and a non-reference divider; outputting, by the reference divider, a first output signal at a first initial divide ratio; outputting, by the non-reference divider, a second output signal at a second initial divide ratio; comparing phases of the first and second output signals using phase detection circuitry; outputting, by the phase detection circuitry, an error sign signal indicating whether the second output signal leads or lags the first output signal and also outputting a divide ratio slip signal; and adjusting the second output signal based on the error sign signal and the divide ratio slip signal to align a specific edge of the second output signal with the specific edge of the first output signal.

In an example, a system comprises m output channels, in which m is an integer of 3 or more; a ring bus clock line coupling the m output channels; and m instances of component timing circuitry coupled to the m output channels, respectively. Each instance of component timing circuitry includes a component, e.g., a divider, detection circuitry, control circuitry, and aligning circuitry. The component outputs a component output signal to be aligned with a reference output signal, which may originate from another component of another of the m instances of component timing circuitry. The detection circuitry is configured to receive the component output signal and the reference output signal, and determine whether the component output signal leads or lags the reference output signal. The control circuitry is configured to receive a timing clock signal from the component, and receive a first alignment status signal from the detection circuitry. The aligning circuitry is configured to align the component output signal with the reference output signal based on signals received from the detection circuitry and a second alignment status signal received from the control circuitry.

These and other features will be better understood from the following detailed description with reference to the accompanying drawings.

BRIEF DESCRIPTION OF THE DRAWINGS

Features of the disclosure may be understood from the following figures taken in conjunction with the detailed description.

The same reference numbers are used in the drawings to designate the same or similar (structurally and/or functionally) features.

DETAILED DESCRIPTION

Figure 1:
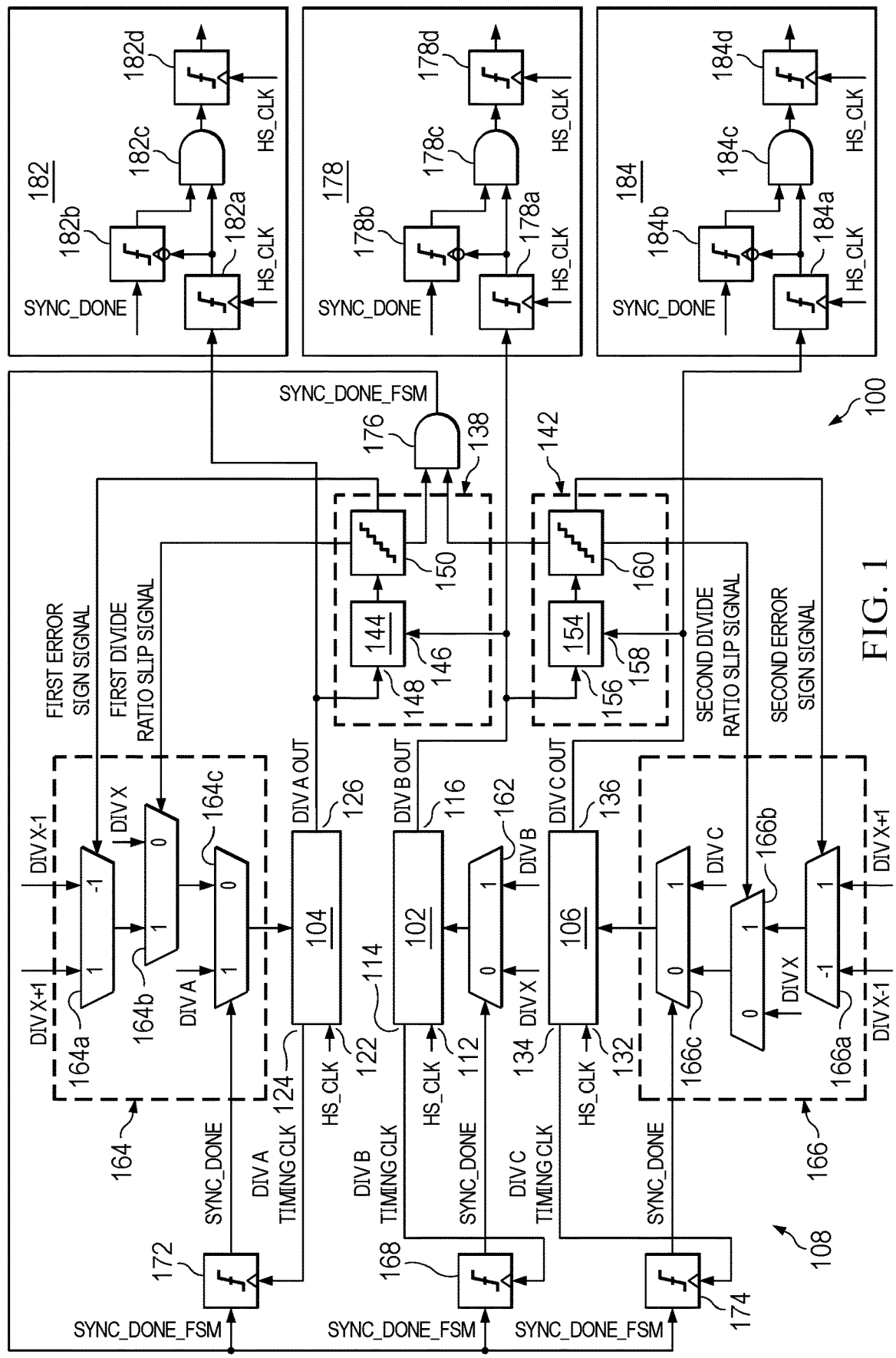
FIG. 1 is a schematic diagram of an example system including multiple dividers and an example timing alignment circuit.

Specific examples are described below in detail with reference to the accompanying figures. These examples are not intended to be limiting. In the drawings, corresponding numerals and symbols generally refer to corresponding parts unless otherwise indicated. The objects depicted in the drawings are not necessarily drawn to scale.

In example arrangements, output signals of multiple dividers are synchronized during operation without resetting the dividers. The dividers may be started at the same divide ratio, but their output signals may be out of phase. Using phase detection, aligning and control circuitry, the output signals of the dividers are aligned, after which the dividers may be synchronously switched to their final divide ratios. A specific edge (e.g., rising edge) of the multiple output signals are aligned at a specific time point, after which each divider may operate at its final divide ratio. In an example, the final divide ratios are selected such that the output signals of the dividers remain aligned at the least common multiple of the final divide ratios. One divider is used as a reference divider, and adjustment is made to the output signal(s) of the non-reference divider(s) to align a rising/falling edge of each with a corresponding rising/falling edge of the output signal of the reference divider. In an example, a signal is asserted when edge alignment is achieved. The phase detection and alignment scheme described herein may be applied to single or multiple clock domain environments.

FIG. 1 is a schematic diagram of a system 100 including multiple dividers 102, 104 and 106, and an example timing alignment circuit generally indicated by reference numeral 108. System 100, or portions thereof, may be implemented as a single integrated circuit. Divider 102 is a reference divider, and dividers 104 and 106 are each a non-reference divider. Although FIG. 1 shows two non-reference dividers, system 100 may include from one to n−1 non-reference dividers, where n represents the total number of dividers including reference divider 102 and may be any suitable integer of 2 or more. Dividers 102, 104, 106, etc. of system 100 may reside in a single clock domain, in which all dividers are based on one root or reference clock signal (HS_CLK). In some applications, e.g., JESD204B/C applications, root clock signal HS_CLK may be of a relatively high frequency, such as on the order of several GHz. The root clock signal is distributed to dividers 102, 104, 106, etc.

Reference divider 102 has a clock input 112, a clock output 114, and a data output 116. Based on root clock signal HS_CLK that is input to clock input 112, reference divider 102 generates a first output signal (DIV B OUT) at data output 116. Reference divider 102 also outputs at clock output 114 a first timing clock signal (DIV B TIMING CLK), which is used for alignment. Non-reference dividers 104 and 106 are similarly constructed. Non-reference divider 104 has a clock input 122 configured to receive the root clock signal, a clock output 124 at which a second timing clock signal (DIV A TIMING CLK) is output for alignment, and a data output 126 at which a second output signal (DIV A OUT) is output. Non-reference divider 106 has a clock input 132 for the root clock signal, a clock output 134 at which a third timing clock signal (DIV C TIMING CLK) is output for alignment, and a data output 136 at which a third output signal (DIV C OUT) is output. Each additional non-reference divider that may be added to system 100 may be constructed similarly. Each of the first, second and third output signals may be considered or function as a clock signal for one or more others components, e.g., integrated circuit(s), and/or electronic device(s).

Example timing alignment circuit 108 includes two instances of detection circuitry: detection circuitry 138 for comparing the phases of the first and second output signals, and detection circuitry 142 for comparing the phases of the first and third output signals. More generally, the number of instances of detection circuitry depends on the number of dividers in system 100. For n dividers, there are n−1 instances of detection circuitry, each configured to compare the phase of the data signal of a respective one of the n−1 non-reference dividers to the data signal of reference divider 102.

Detection circuitry 138 includes a phase detector 144 that has inputs 146 and 148 coupled to data outputs 116 and 126, respectively, to receive the first and second output signals. Phase detector 144 is configured to compare the phases of the first and second output signals and output a comparison signal to a filter 150, which filters the comparison signal. Filter 150 then outputs a first error sign signal indicating whether the phase of the second output signal leads or lags the phase of the first output signal. Filter 150 also outputs a first divide ratio slip signal.

Detection circuitry 142 includes a phase detector 154 with inputs 156 and 158 coupled to data outputs 116 and 136, respectively, to receive the first and third output signals. Phase detector 154 is configured to compare the phases of the first and third output signals and output a comparison signal to filter 160, which filters the comparison signal. Filter 160 then outputs a second error sign signal indicating whether the phase of the third output signal leads or lags the phase of the first output signal, and also outputs a second divide ratio slip signal.

Each of phase detectors 144 and 154 may be a linear phase detector, a non-linear phase detector such as a bang-bang phase detector, a time-to-digital converter (TDC), or any other detector capable of phase detection within one cycle of the root clock signal. Each of filters 150 and 160 may be configured to ensure accuracy of the leading or lagging determination made by the filter by waiting a set number of cycles before outputting the error sign signal and divide ratio slip signal.

The first and second error sign signals, as well as the first and second divide ratio slip signals are used in the alignment process. A negative error sign in an error sign signal may indicate that the phase of the data signal from the corresponding non-reference divider lags the phase of the reference divider data signal, while a positive error sign signal indicates the opposite. Each additional instance of detection circuitry that may be included is configured to output an error sign signal and divide ratio slip signal in response to comparison of the phase of the data signal of the corresponding additional divider with the first output signal.

Example timing alignment circuit 108 further includes control circuitry 162 coupled to reference divider 102, and in the illustrated embodiment, two instances of aligning circuitry 164 and 166 to align the second output signal of non-reference divider 104 with the first output signal of reference divider 102 and to align the third output signal of non-reference divider 106 with the first output signal, respectively. More generally, timing alignment circuit 108 includes n−1 instances of aligning circuitry, each configured to align a respective one of the n−1 data signals of the n−1 non-reference dividers with the first output signal.

Example timing alignment circuit 108 further includes n control flip-flops, where n is 3 in the illustrated embodiment. Control flip-flop 168 is associated with reference divider 102 and control circuitry 162. Control flip-flop 172 is associated with non-reference divider 104 and aligning circuitry 164. Control flip-flop 174 is associated with non-reference divider 106 and aligning circuitry 166.

In an example, control circuitry 162 is a multiplexer that selects one of two divide ratio signals, i.e., a signal indicating the initial divide ratio of reference divider 102 (DIV X) or a signal indicating the final divide ratio of reference divider 102 (DIV B). Which signal multiplexer 162 selects and outputs to reference divider 102 is controlled by a first local sync status signal (SYNC_DONE) received from control flip-flop 168, the first timing clock signal received from reference divider 102, and a global sync status signal (SYNC_DONE_FSM).

In an example, aligning circuitry 164 includes three multiplexers: 164a, 164b and 164c. Multiplexer 164a selects either a divide ratio signal indicating an incremented or a decremented final divide ratio of reference divider 102, i.e., DIV X+1 or DIV X−1, based on the first error sign signal. If the first error sign signal indicates that the second output signal (from non-reference divider 104) leads the first output signal (from reference divider 102), multiplexer 164a selects DIV X−1, whereas if the first error sign signal indicates that the second output signal lags the first output signal, multiplexer 164a selects DIV X+1. Multiplexer 164b receives the signal output by multiplexer 164a (i.e., either DIV X+1 or DIV X−1) and also receives DIV X. Multiplexer 164b selects one of DIV X±1 and DIV X based on the first divide ratio slip signal, and outputs the selected signal to multiplexer 164c, which also receives as an input a signal indicating the final divide ratio of non-reference divider 104 (DIV A). Which signal multiplexer 164c selects and outputs to non-reference divider 104 is controlled by a second local sync status signal (SYNC_DONE) received from control flip-flop 172, the second timing clock signal received from non-reference divider 104, and the global sync status signal (SYNC_DONE_FSM).

In an example, aligning circuitry 166 includes three multiplexers: 166a, 166b and 166c. Multiplexer 166a selects either DIV X+1 or DIV X−1 based on the second error sign signal. If the second error sign signal indicates that the third output signal (from non-reference divider 106) leads the first output signal (from reference divider 102), multiplexer 166a selects DIV X−1, whereas if the second error sign signal indicates that the third output signal lags the first output signal, multiplexer 166a selects DIV X+1. Multiplexer 166b receives the signal output by multiplexer 166a (i.e., either DIV X+1 or DIV X−1) and also receives DIV X. Multiplexer 166b selects one of DIV X±1 and DIV X based on the second divide ratio slip signal, and outputs the selected signal to multiplexer 166c, which also receives as an input a signal indicating the final divide ratio of non-reference divider 106 (DIV C). Which signal multiplexer 166c selects and outputs to non-reference divider 106 is controlled by a third local sync status signal (SYNC_DONE) received from control flip-flop 174, the third timing clock signal received from non-reference divider 106, and the global sync status signal.

Example timing alignment circuit 108 further includes sync completion circuitry 176, which in the illustrated embodiment is an AND gate. AND gate 176 has n−1 inputs respectively coupled to the n−1 instances of detection circuitry. In the illustrated example, AND gate 176 has two inputs: one coupled to filter 150 of detection circuitry 138 and the other coupled to filter 160 of detection circuitry 142. When the second output signal is aligned with the first output signal, filter 150 outputs a signal (e.g., a logic high signal) to AND gate 176 indicating such alignment, and when the third output signal is aligned with the first output signal, filter 160 outputs a signal (e.g., also a logic high signal) to AND gate 176 indicating such alignment. When a logic high signal is received from each of filter 150 and filter 160, AND gate 176 outputs the global sync status signal to control flip-flops 168, 172 and 174.

Example timing alignment circuit 108 further includes n instances of output circuitry, one instance for each divider in system 100. In the illustrated embodiment, first output circuitry 178 is associated with reference divider 102, second output circuitry 182 is associated with non-reference divider 104, and third output circuitry 184 is associated with non-reference divider 106.

First output circuitry 178 includes output flip-flop 178a coupled to receive the first output signal and the root clock signal and to output a first intermediate output signal. Output flip-flop 178b is coupled to receive the first local sync status signal and the first intermediate output signal and to output a second intermediate output signal. An AND gate 178c receives the first and second intermediate output signals. Output flip-flop 178d is disposed downstream of AND gate 178c to receive a third intermediate output signal from AND gate 178c when both of the first and second intermediate output signals are logic high.

Second output circuitry 182 is similarly configured, except that output flip-flop 182a at the front-end receives the second output signal, and output flip-flop 182b receives the second local sync status signal. Fourth and fifth intermediate output signals are output from flip-flops 182a and 182b, respectively, and input to AND gate 182c, which outputs a sixth intermediate output signal when both the fourth and fifth intermediate output signals are logic high.

Third output circuitry 184 is also similarly configured. In this case, though, output flip-flop 184a receives the third output signal, and output flip-flop 184b receives the third local sync status signal. Seventh and eighth intermediate output signals are output from flip-flops 184a and 184b, respectively, and input to AND gate 184c, which outputs a ninth intermediate output signal when both the sixth and seventh intermediate output signals are logic high.

The output signal of flip-flop 178d is at the final divide ratio (e.g., DIV B) of reference divider 102. The output signal of flip-flop 182d is at the final divide ratio (e.g., DIV A) of non-reference divider 104, and the output signal of flip-flop 184d is at the final divide ratio (e.g., DIV C) of non-reference divider 106.

In an example, the initial divide ratios of all dividers in system 100, e.g., dividers 102, 104 and 106, are the same, which is DIV X. With an initial common divide ratio, at each iteration, each instance of aligning circuitry 164 and 166 provides a divide ratio signal to its corresponding divider 104 or 106 of DIV X, DIV X−1, DIV X+1, or its corresponding final divide ratio.

Figure 2:
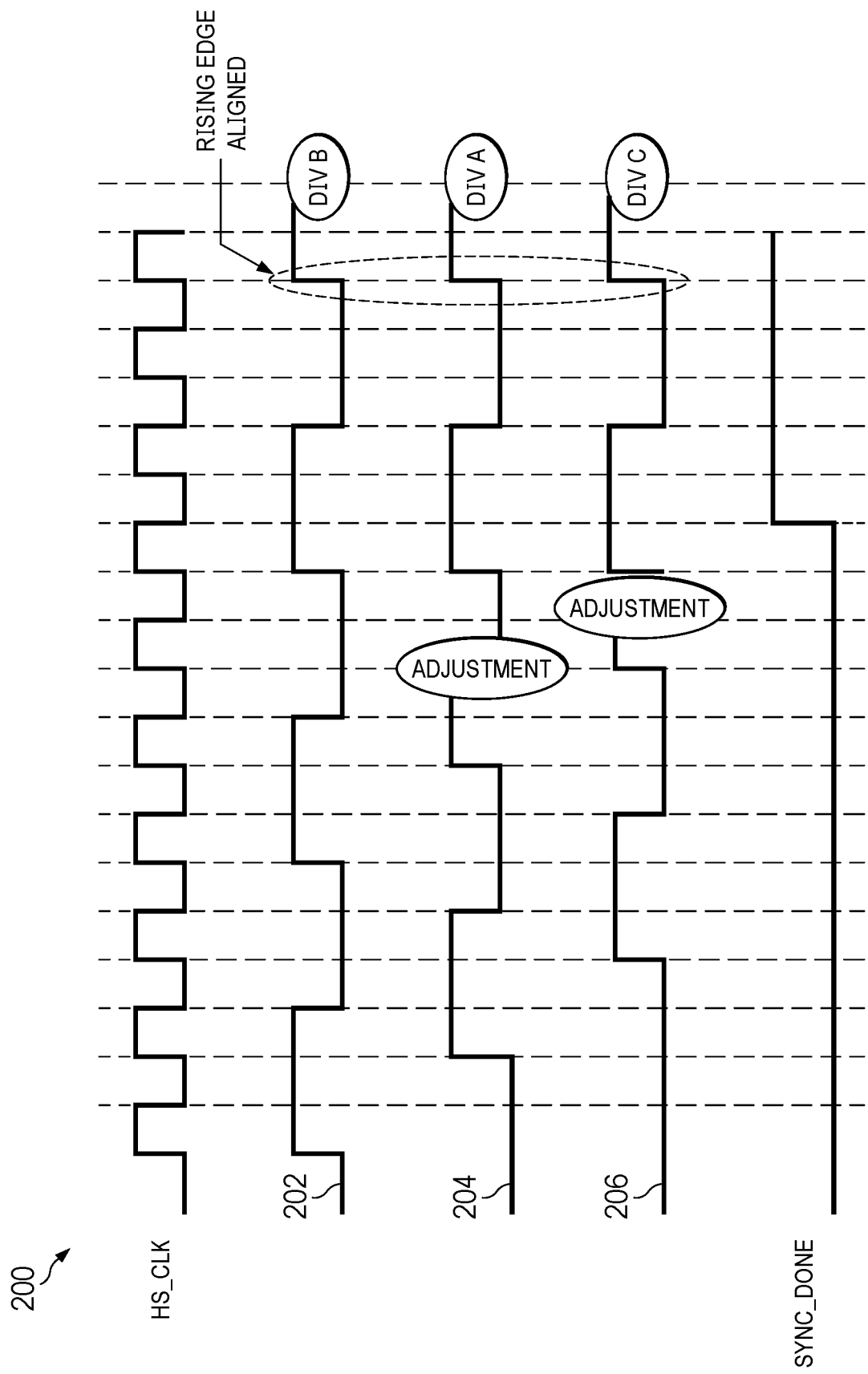
FIG. 2 is an example timing diagram of various signals generated in the example system of FIG. 1.

FIG. 2 illustrates adjustment of output signals 202, 204 and 206 of dividers 102, 104 and 106, respectively. Dividers 102, 104 and 106 are started at the same common divide ratio and thus have the same frequency but are out of phase. With dividers 102, 104 and 106 up and running, timing alignment circuit 108 adjusts the phases of signals 204 and 206 with respect to signal 202. A SYNC_DONE signal, corresponding to the global sync status signal (SYNC_DONE_FSM) output by AND gate 176 in FIG. 1, is asserted at logic high after rising edges of output signals 202, 204 and 206 are first aligned, but system 100 may be configured to wait one cycle until the next time point at which the rising edges are again aligned to switch to the final divide ratios. In response to the global sync status signal, each of control flip-flops 168, 172 and 174 outputs its local sync status signal to its corresponding divider 102, 104 and 106 and to its corresponding output circuitry 178, 182 and 186. Signals 202, 204 and 206 may then be switched to their final divide ratios: DIV B, DIV A, and DIV C, respectively. Timing alignment circuitry 108 and output circuitry 178, 182 and 186 may be realized as synchronous logic, such that each divider 102, 104 and 106 can deterministically "jump" from one divide ratio to another without causing a timing glitch, and at a fixed latency.

Timing alignment circuitry 108 may be configured to align all dividers of a system, as described above, or may be configured to align only select dividers within a system. Moreover, the system to which timing alignment 108 is applied may be a single domain or multiple independent domains, each having multiple dividers.

Figure 3:
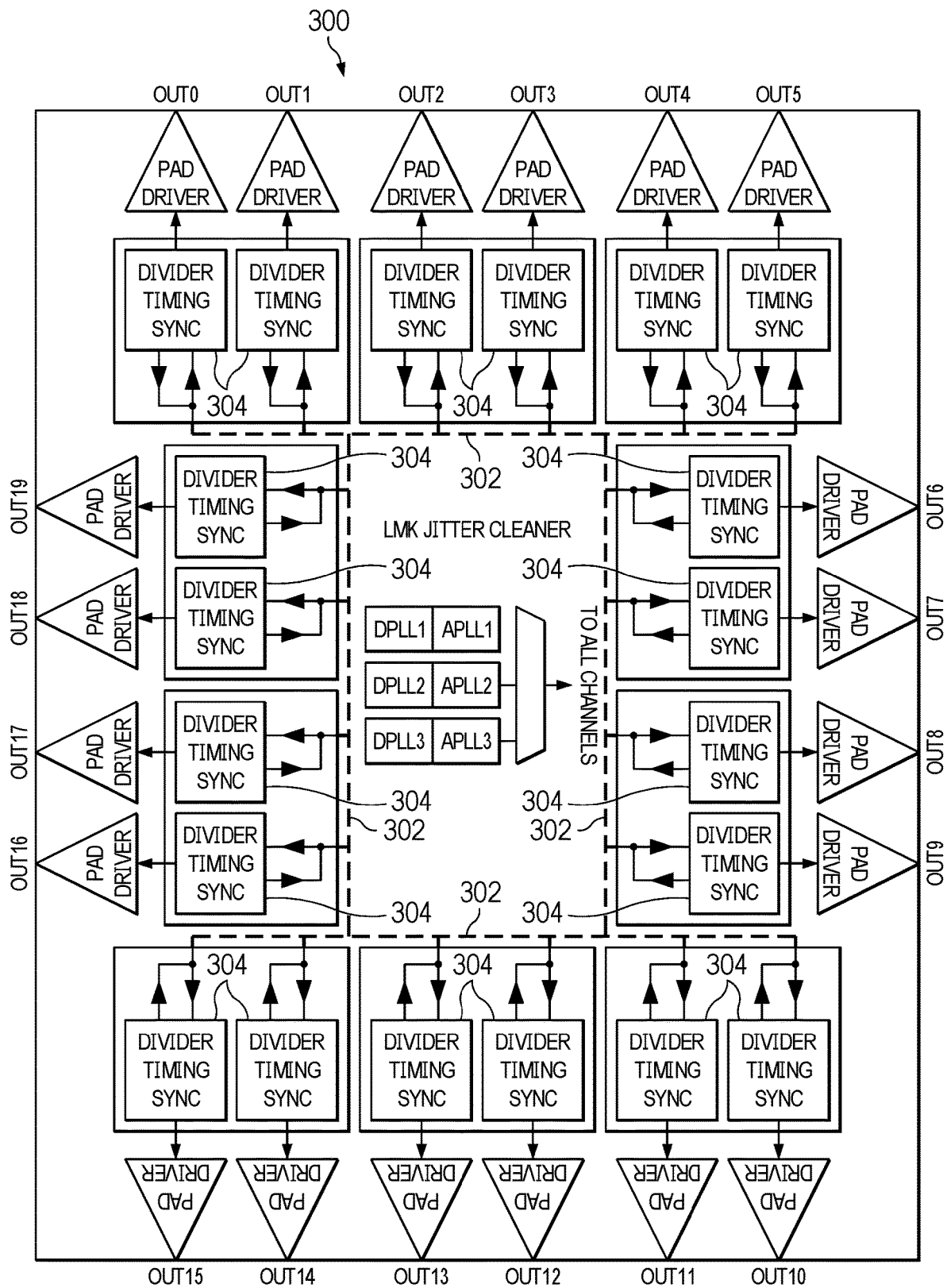
FIG. 3 is a schematic diagram of an example multi-channel semiconductor chip in which one or more of the channel output signals may be synchronized with another channel output signal used as reference.

Another application of timing alignment circuitry 108 is a channel environment. FIG. 3 shows a semiconductor chip 300 with m output channels, where m may be 20 (e.g., OUT0-OUT19). The m channels may be coupled via a tri-state send/receive ring bus clock line 302. Different subsets of the m channels may operate under different clock domains. Disposed on semiconductor chip 300 is m instances of a divider timing sync circuit 304, one for each output channel. Each divider timing sync circuit 304 is a portion of timing alignment circuit 108. Each divider timing sync circuit 304 may be used to align its associated channel output with another channel output used as a reference.

Figure 4:
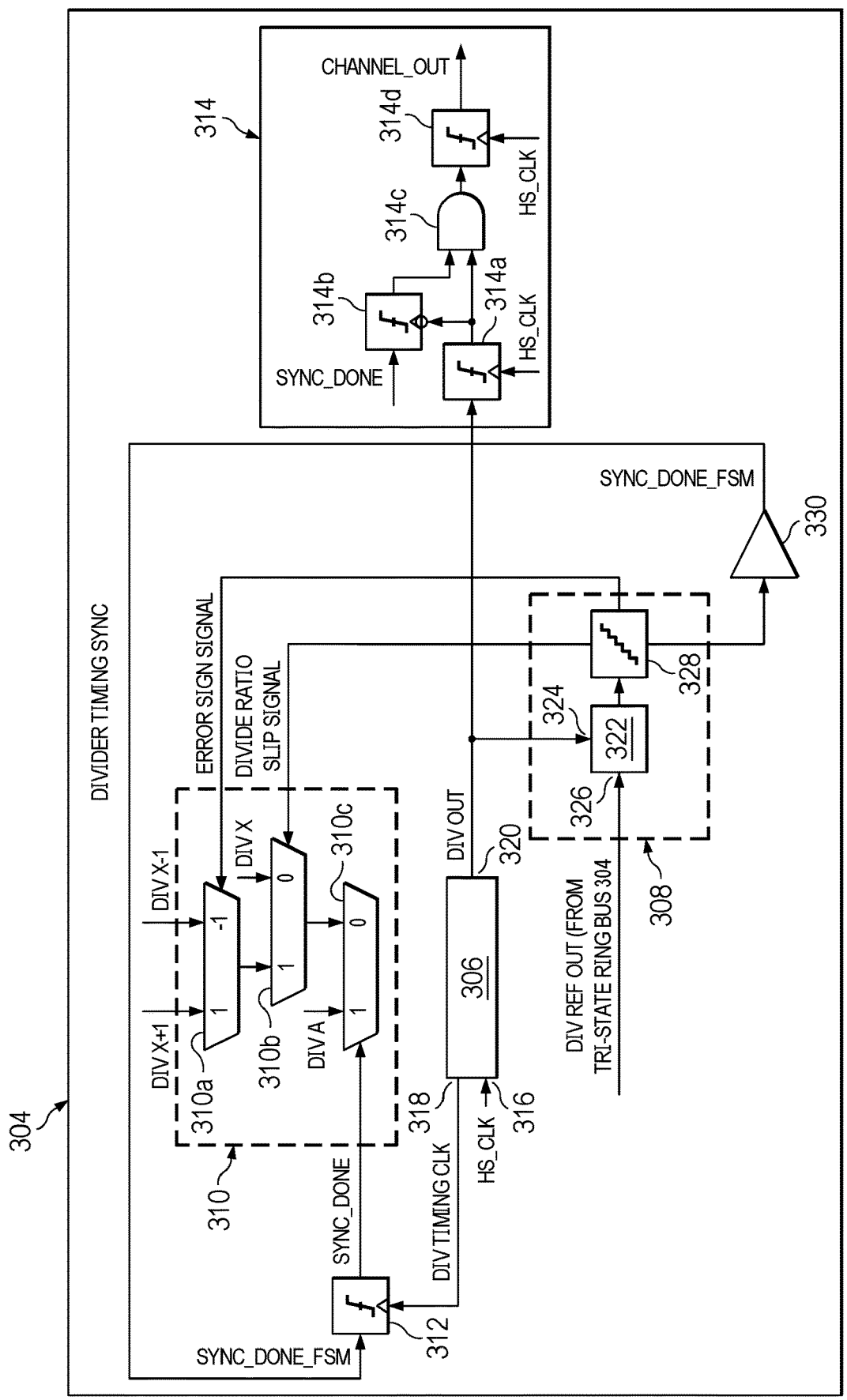
FIG. 4 is a schematic diagram of an example divide timing sync circuit, instances of which may be employed in the example multi-channel semiconductor chip shown in FIG. 3.

FIG. 4 is a schematic diagram of an example divide timing sync circuit 304, multiple instances of which may be incorporated into semiconductor chip 300. Divide timing sync circuit 304 includes a divider 306. Similar to each non-reference divider 104, 106 in FIG. 1, divider 306 is associated with detection circuitry 308, aligning circuitry 310, a control flip-flop 312, and output circuitry 314. These components function substantially the same as their respective counterparts in FIG. 1.

Divider 306 has a clock input 316 for a root clock signal (HS_CLK), a clock output 318 at which a timing clock signal (DIV TIMING CLK) is output for alignment, and a data output 320 at which an output signal (DIV OUT) is output. Detection circuitry 308 includes a phase detector 322 that has inputs 324 and 326 coupled to data output 320 and tri-state ring bus clock line 302, respectively, to receive DIV OUT and a reference divider output signal (DIV REF OUT) received from tri-state ring bus clock line 302. Phase detector 322 is configured to compare the phases of DIV OUT and DIV REF OUT and output a comparison signal to a filter 328 of detection circuitry 308. After filtering the comparison signal, filter 328 outputs an error sign signal indicating whether the phase of DIV OUT leads or lags the phase of the DIV REF OUT. Filter 328 also outputs a divide ratio slip signal. The error sign signal and divide ratio slip signal are used in the alignment process by aligning circuitry 310, which includes three multiplexers: 310a, 310b and 310c. The error sign signal controls multiplexer 310a to output one or the other of its two input signals: DIV X+1 and DIV X−1. The divide ratio slip signal controls multiplexer 310b to output one or the other of its input signals: the output of multiplexer 310a and DIV X. Multiplexer 310c is controlled by a sync status signal (SYNC_DONE) of control flip-flop 312 to output one or the other of its input signals: the output of multiplexer 310b and DIV A (the final divide ratio of divider 306). Control flip-flop 312 receives as inputs the timing clock signal (DIV TIMING CLK) from divider 306, as well as another sync status signal (SYNC_DONE_FSM) from a buffer 330 of divider timing sync circuit 304. Buffer 330 receives (SYNC_DONE_FSM) from filter 328 when it is determined that the two divider output signals are aligned and after a delay issues the SYNC_DONE_FSM to control flip-flop 312.

Output circuitry 314 is configured substantially the same as any of output circuitry 178, 182 and 184. To that end, output circuitry 314 includes three flip-flops 314a, 314b and 314d, as well as AND gate 314c. The output signal (DIV OUT) of divider 306 is input to flip-flop 314a at the front end, and flip-flop 314d outputs a signal (CHANNEL_OUT) at the final divide ratio of divider 306.

Figure 5:
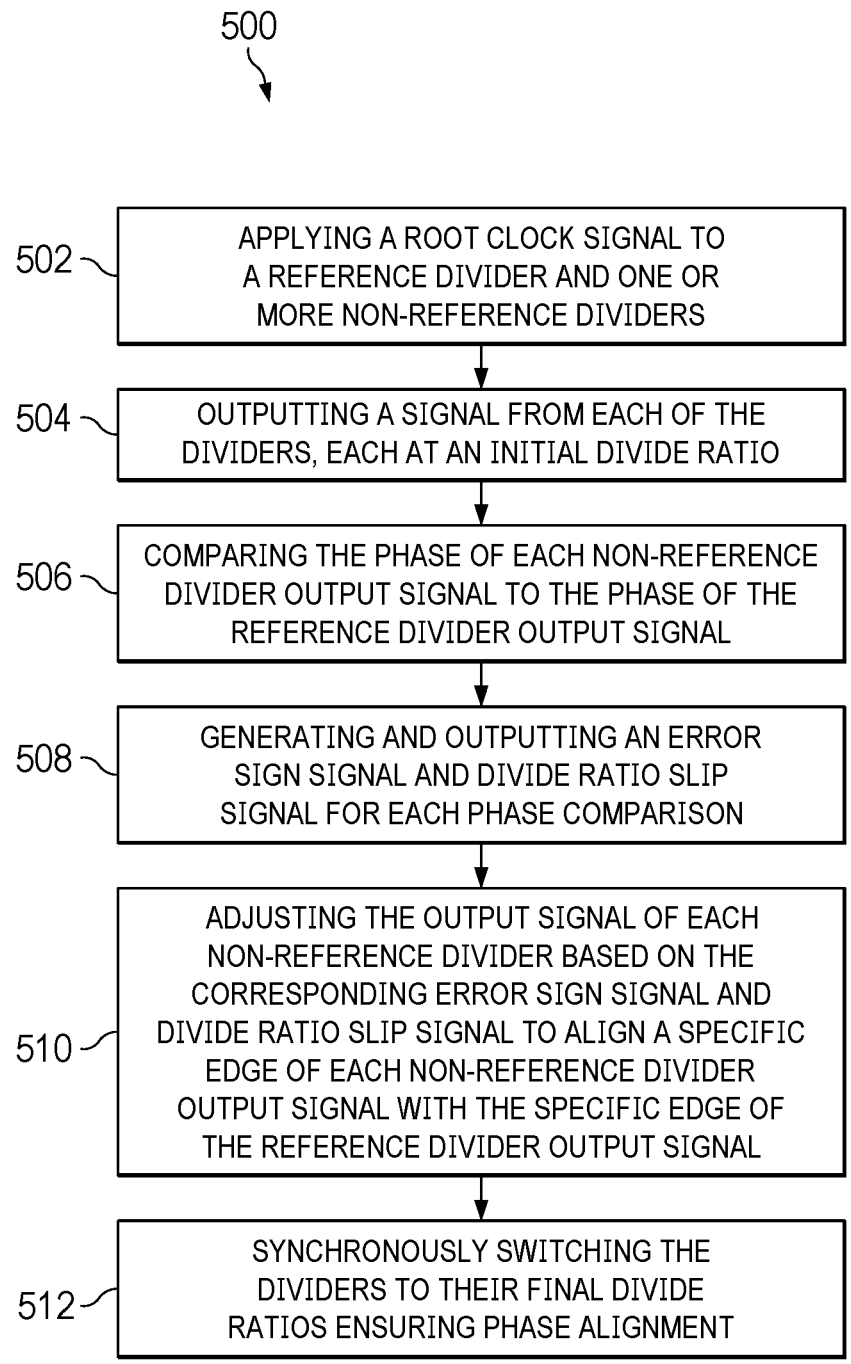
FIG. 5 is a flow diagram of an example method of operating a timing alignment circuit, such as that shown in FIG. 1.

FIG. 5 is a flow diagram of an example method 500 of aligning the output signals of multiple dividers without resetting any of the dividers. In operation 502, a root (or reference) clock signal is applied to a reference divider and one or more non-reference dividers to bring the dividers up and running. In response, each divider outputs an output signal (operation 504). Initially, each divider may have the same divide ratio, so each of the output signals is of the same frequency. However, the output signals are out of phase. To synchronize the divider output signals, the phase of each non-reference divider output signal is compared with the reference divider output signal in operation 506. For each comparison, an error sign signal and a divide ratio slip signal is generated and output in operation 508. The error sign signal and divide ratio slip signal resulting from a given comparison is used in operation 510 to align a specific edge (e.g., rising edge) of the non-reference divider output signal of that comparison with the specific edge of the reference divider output signal. In operation 512, the dividers are synchronously switched to their final divide ratios ensuring phase alignment. Thus, the dividers are phase aligned but without having to perform a synchronous reset.

FIG. 5 depicts one possible order of operations to align the output signals of multiple dividers. Not all operations need necessarily be performed in the order described. Two or more operations may be combined into a single operation. Some operations may be performed substantially simultaneously. Additional operations and/or alternative operations may be performed consistent with the description herein.

Examples of a scalable timing alignment circuit that may be used in any of multiple clock generating environments to synchronize the output signals of multiple dividers or other clock generating components are provided. In some examples, the output signals of multiple dividers, initially running at the same divide ratio, are synchronized at particular time, using one of the dividers as a reference, after which the multiple dividers are synchronously switched to their final divide ratios. Since the latency through the dividers is predictable, the timing alignment circuit and underlying algorithm ensures phase alignment when the dividers are changed to their final divide ratios. Example timing alignment circuits have the ability to predictably, synchronously and without glitch update the dividers to any final divide ratios. Flip-flops in the system need not be reset to achieve the synchronization, thus enabling them to operate at the highest speeds the process allows. The dividers can power up in any state and then be synchronized. The alignment process is relatively fast and may be used multiple times during operation without turning off or resetting any components in the system.

The term "couple" is used throughout the specification. The term and derivatives thereof may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

An "output" identified as part of a component may be a terminal, pin, interconnection, lead or node of the component to couple that component to another component. Either such component may be a device element, a circuit element, an integrated circuit, a device or other electronic or semiconductor component.

A circuit or device that is described herein as including certain components may instead be adapted to be coupled to those components to form the described circuitry or device. For example, certain components of the circuit or device may be formed within a single physical device (e.g., a semiconductor die and/or integrated circuit (IC) package) and may be adapted to be coupled to other components to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as logic gates may be configured in any suitable way to provide the specific logic function.

The term "divider" as used herein includes any component that generates an output signal at a specific divide ratio that may be switched to another divide ratio. Unless otherwise stated, "about," "approximately," or "substantially" preceding a value means +/−10 percent of the stated value.

Modifications of the described examples are possible, as are other examples, within the scope of the claims. Moreover, features described herein may be applied in other environments and applications consist with the teachings provided.

What is claimed is:

1. A timing alignment circuit, comprising:
    detection circuitry having a first input, a second input, a first output and a second output;
    control circuitry having an input and an output; and
    aligning circuitry having an first input coupled to the first output of the detection circuitry, a second input coupled to the second output of the detection circuitry, a third input and an output.

2. The timing alignment circuit of claim 1, wherein the detection circuitry includes:
    a phase detector having first and second inputs coupled to the first and second inputs of the detection circuitry respectively and an output; and
    a filter having an input coupled to the output of the phase detector circuitry, a first output and a second output.

3. The timing alignment circuit of claim 1, wherein the control circuitry includes a first multiplexer having a first input coupled to the input of the control circuitry and having l an output, the first multiplexer further having a second input and a third input.

4. The timing alignment circuit of claim 3, wherein the aligning circuitry includes:
    a second multiplexer coupled to the first output of the aligning circuitry;
    a third multiplexer coupled to the second output of the aligning circuitry and
    a fourth multiplexer coupled to the third output of the aligning circuitry the fourth multiplexer having the second control output.

5. The timing alignment circuit of claim 4, wherein:
    the second multiplexer is configured to increment or decrement a first divide ratio signal based on an error sign signal and output an adjusted first divide ratio signal;
    the third multiplexer is configured to output one of the adjusted first divide ratio signal and the first divide ratio signal based on a divide ratio slip signal; and the fourth multiplexer is configured to output at the second control output one of the outputs of the second multiplexer and a third divide ratio signal as the second control output signal based on a second local sync status signal.

6. The timing alignment circuit of claim 1, further comprising:
a first control flip-flop configured to output a first local sync status signal based on a first timing clock signal and a global sync status signal; and
a second control flip-flop configured to output a second local sync status signal based on a second timing clock signal and the global sync status signal.

7. The timing alignment circuitry of claim 1, further comprising:
first output circuitry including
a first output flip-flop, and
a second output flip-flop; and
second output circuitry including
a third output flip-flop, and
a fourth output flip-flip.

8. The timing alignment circuitry of claim 7, wherein:
the first output circuitry further includes first logic; and
the second output circuitry further includes second logic circuitry.

9. The timing alignment circuitry of claim 8, wherein:
the first output circuitry further includes a fifth output flip-flop; and
the second output circuitry further includes a sixth output flip-flop.

10. The timing alignment circuitry of claim 9, wherein, at a set time, a specific edge of a second final output signal of the second component is aligned with the specific edge of a first final output signal of the first component.

11. A system comprising:
n dividers including a reference divider, and n−1 non-reference dividers, each of the n dividers configured to output a data signal, wherein n is an integer of 2 or greater;
n−1 instances of detection circuitry, coupled to the n−1 non-reference dividers, respectively, each instance of detection circuitry configured to determine whether the data signal of the corresponding non-reference divider leads or lags the data signal of the reference divider and issue a corresponding error signal based on the determination;
control circuitry coupled to the reference divider;
n−1 instances of aligning circuitry, each configured to align a respective one of the data signals of the n−1 non-reference dividers with the data signal of the reference divider; and
sync completion circuitry configured to output a global sync status signal responsive to the data signals of the n−1 non-reference dividers being aligned with the data signal of the reference divider.

12. The system of claim 11, further comprising:
n control flip-flops including a reference control flip-flop coupled to the reference divider and the control circuitry, and n−1 non-reference control flip-flops, each coupled to a respective one of the n-1 non-reference dividers and a respective one of the n−1 instances of aligning circuitry.

13. The system of claim 12, wherein each of the n−1 instances of detection circuitry includes: a phase detector configured to receive the data signal output by the corresponding non-reference divider and the data signal output by the reference divider and further configured to output a phase comparison signal; and
a filter configured to receive the phase comparison signal output by the associated phase detector and further configured to output an error sign signal and a divide ratio slip signal to the corresponding aligning circuitry.

14. The system of claim 13, further comprising:
n instances of output circuitry, including reference output circuitry configured to receive the data signal of the reference divider, and n−1 instances of non-reference output circuitry, each configured to receive the data signal of a respective one of the non- reference dividers.

15. A method, comprising:
applying a root clock signal to a reference divider and a non-reference divider;
outputting, by the reference divider, a first output signal at a first initial divide ratio;
outputting, by the non-reference divider, a second output signal at a second initial divide ratio;
comparing phases of the first and second output signals using phase detection circuitry;
outputting, by the phase detection circuitry, an error sign signal indicating whether the second output signal leads or lags the first output signal and also outputting a divide ratio slip signal; and
adjusting the second output signal based on the error sign signal and the divide ratio slip signal to align a specific edge of the second output signal with the specific edge of the first output signal.

16. The method of claim 15, wherein each of the first initial divide ratio and the second initial divide ratio is the same.

17. The method of claim 16, further comprising:
switching the first initial divide ratio of the first output signal to a first final divide ratio and switching the second initial divide ratio of the second output signal to a second final divide ratio after the adjusting is complete.

18. The method of claim 17, wherein the adjusting includes:
performing a first selection operation of selecting one of an incremented first initial divide ratio or a decremented first initial divide ratio as a first intermediate divide ratio based on the error sign signal;
performing a second selection operation of selecting one of the first intermediate divide ratio and the first initial divide ratio as a second intermediate divide ratio based on the divide ratio slip signal;
performing a third selection operation of selecting one of the second intermediate divide ratio and the second final divide ratio as a non-reference divider control signal based on a non-reference divider local sync status signal; and
inputting the non-reference divider control signal to the non-reference divider.

19. The method of claim 18, further comprising:
performing a fourth selection process of selecting one of the first initial divide ratio and the first final ratio as a reference divider control signal based on a reference divider local sync status signal; and
inputting the reference divider control signal to the reference divider.

20. The method of claim 19, wherein:
the non-reference divider local sync status signal is based on a global sync status signal and a timing signal from the non-reference divider, and the reference divider local sync status signal is based on the global sync status signal and a timing signal from the reference divider.

21. A system comprising:
m output channels, in which m is an integer of 3 or more;
a ring bus clock line coupling the m output channels; and
m instances of component timing circuitry coupled to the m output channels, respectively;
each of the m instances of component timing circuitry including:
  a component configured to output a component output signal;
  detection circuitry configured to:
    receive the component output signal and a reference output signal, and
    determine whether the component output signal leads or lags the reference output signal;
  control circuitry configured to:
    receive a timing clock signal from the component, and
    receive a first alignment status signal from the detection circuitry; and
  aligning circuitry configured to align the component output signal with the reference output signal based on signals received from the detection circuitry and a second alignment status signal received from the control circuitry.

22. The system of claim 21, wherein each of the m instances of component timing circuitry include output circuitry coupled to the component.

23. The system of claim 21, wherein each of the m instances of component timing circuitry include a buffer coupled between the detection circuit and the control circuitry to pass the first alignment status signal to the control circuitry.

* * * * *